(12) United States Patent
Nakao

(10) Patent No.: US 6,743,554 B2
(45) Date of Patent: Jun. 1, 2004

(54) PHOTOMASK FOR ABERRATION MEASUREMENT, ABERRATION MEASUREMENT METHOD UNIT FOR ABERRATION MEASUREMENT AND MANUFACTURING METHOD FOR DEVICE

(75) Inventor: Shuji Nakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 135 days.

(21) Appl. No.: 10/127,434

(22) Filed: Apr. 23, 2002

(65) Prior Publication Data

US 2003/0095247 A1 May 22, 2003

(30) Foreign Application Priority Data

Nov. 22, 2001 (JP) ........................................ 2001-357850

(51) Int. Cl.[7] ................................................ G03F 9/00
(52) U.S. Cl. ............................................ 430/5; 430/30
(58) Field of Search ........................................ 430/5, 30

(56) References Cited

U.S. PATENT DOCUMENTS 6,296,977 B1 * 10/2001 Kaise et al. .................. 430/30
6,613,483 B2 * 9/2003 Fujimoto ....................... 430/5

FOREIGN PATENT DOCUMENTS

| JP | 10-281934 | 10/1998 |
| JP | 10-284368 | 10/1998 |
| JP | 10-288567 | 10/1998 |
| JP | 11-184070 | 7/1999 |
| JP | 11-237310 | 8/1999 |
| JP | 2000-266640 | 9/2000 |

OTHER PUBLICATIONS

"Higher order aberration measurement with printed patterns under extremely reduced σ illumination", Nomura et al., Proc. SPIE, vol. 3679, (1999), pp. 358–367.

"Overlay Error due to Lens Coma and Asymetric Illumination Dependence on Pattern Feature", Nomura et al., Proc. SPIE, vol. 3332, (1998), pp. 199–210.

* cited by examiner

Primary Examiner—Christopher G. Young
(74) Attorney, Agent, or Firm—McDermott, Will & Emery

(57) ABSTRACT

A photomask for aberration measurement of the present invention comprises a substrate that allows exposure light to pass through, a plurality of aperture patterns for measurement that are formed on the top surface of substrate in a plurality of measurement pattern formation regions, a light blocking film that is formed in the measurement pattern formation regions on the rear surface of substrate and that has a rear surface aperture pattern for substantially differentiating the respective incident angles of the exposure light to plurality of aperture patterns for measurement and a plurality of reference patterns that is formed in a single, or in a plurality, of reference pattern formation region(s) on the top surface of substrate, wherein the rear surface of substrate in the reference pattern formation region(s) is formed so that the respective incident angles of the exposure light to plurality of reference patterns becomes the substantially the same.

12 Claims, 15 Drawing Sheets

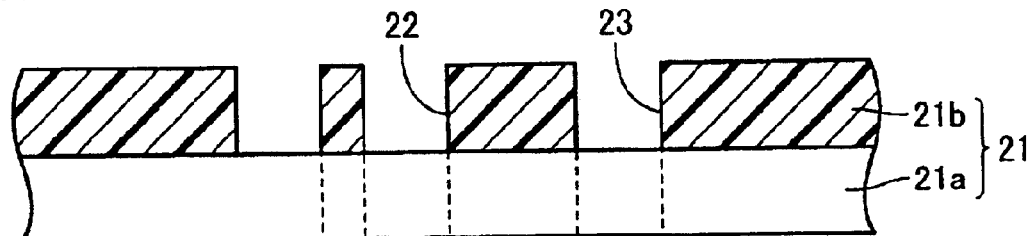
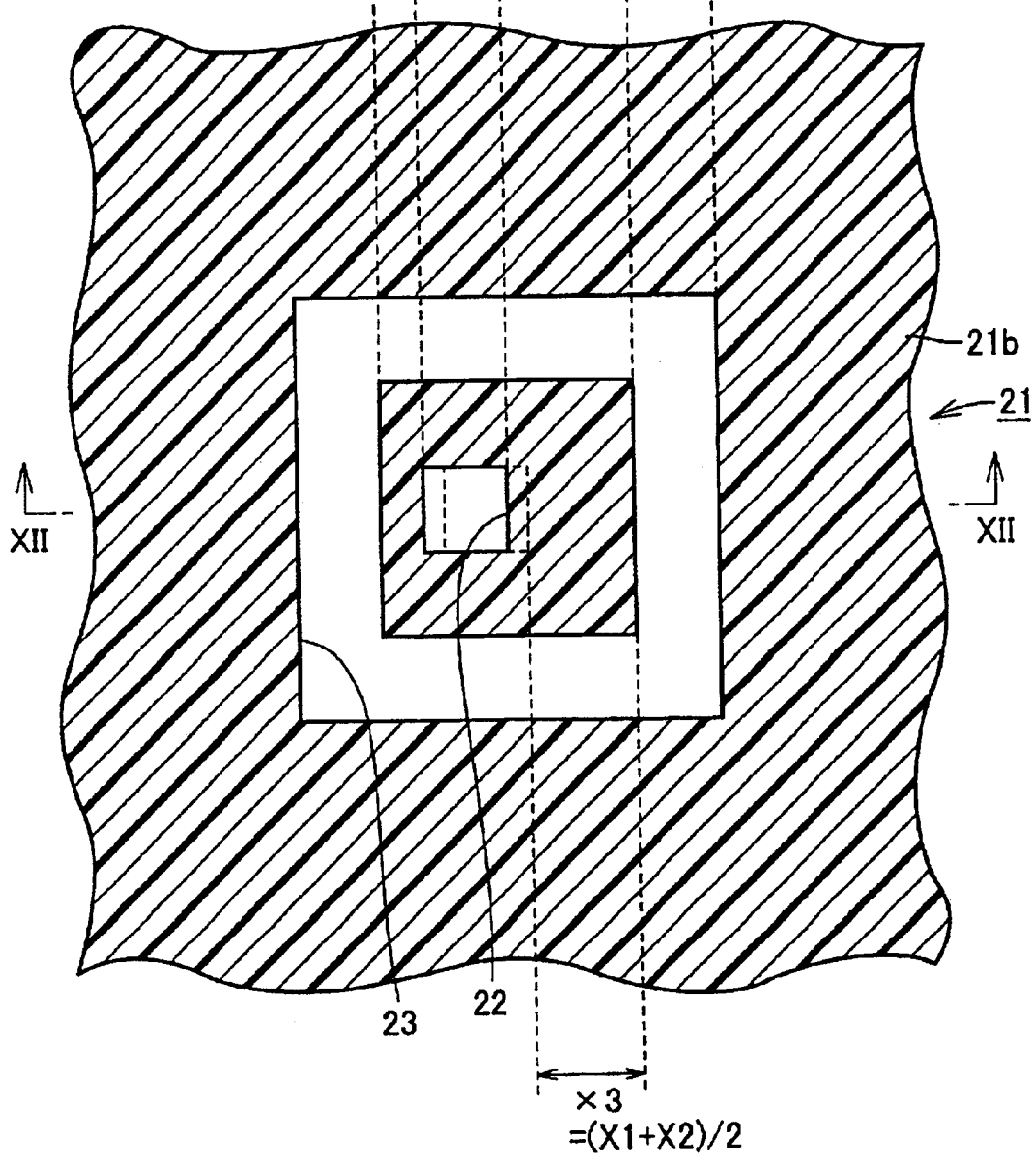

PHOTOMASK FOR ABERRATION MEASUREMENT, ABERRATION MEASUREMENT METHOD UNIT FOR ABERRATION MEASUREMENT AND MANUFACTURING METHOD FOR DEVICE

BACKGROUND OF THE INVENTION

1. Field of the Invention

The present invention relates to a photomask for aberration measurement, an aberration measurement method, a unit for aberration measurement and a manufacturing method for the unit.

2. Description of the Background Art

In recent years increases in integration and miniaturization of semiconductor integrated circuits have been remarkable. Together with that, miniaturization of circuit patterns formed on a semiconductor substrate (hereinafter referred to simply as wafer) has made rapid progress.

In particular, photolithographic technology is widely recognized as a basic technology used for pattern formation. Accordingly, a variety of developments and improvements have recently been implemented. However, the miniaturization of patterns shows no sign of slowing down and demand for increase in pattern resolution has continued to increase.

This photolithographic technology is a technology wherein patterns on a photomask (original image) are transferred to a photoresist applied to a wafer and wherein the etched film, which is the layer beneath the photoresist, is patterned by using the transcription on the photoresist.

At the time of the transcription onto the photoresist, a development process is carried out on the photoresist in which the type of photoresist wherein the portion struck by light is removed through this development process is called a positive type photoresist while the type of photoresist wherein the portion that has not been struck by light is removed is called a negative type photoresist.

In general, the resolution limit R (nm) in the photolithographic technology using a scale down exposure method is represented as:

$$R = k_1 \cdot \lambda / (NA)$$

wherein $\lambda$ is the wavelength (nm) of the utilized light, NA is a numerical aperture in the projection optical system of the lenses and $k_1$ is a constant that depends on the image formation condition and on the resist process.

As can be seen from the above equation, a method of reducing the values of $k_1$ and $\lambda$ while increasing the value of NA may be adopted in order to achieve an increase in the resolution limit R, that is to say, in order to gain microscopic patterns. Namely, the constant that depends on the resist process is reduced while a shorter wavelength and a greater NA value are utilized.

Among these, it is technically difficult to shorten the wavelength of the light source and, therefore, it is required to increase the NA value for the same wavelength. The introduction of a greater NA value, however, makes the focal depth $\delta(\delta = k_2 \cdot \lambda / (NA)^2)$ of light shallow so that there is a problem wherein deterioration of form and of dimensional precision occurs in the formed patterns.

It is necessary to carry out a pattern design wherein the aberration of the projection lens, and the like, are taken into consideration in order to transcribe the patterns of the photomask to the photoresist with a high precision in the above described photolithographic technology. In order to achieve this, it is necessary to precisely measure the aberration of the projection lens, and the like.

As for a conventional method of measuring the aberration of the projection lens, there is a method shown in the following Reference 1.

Reference 1: H. Nomura et al., "Higher order aberration measurement with printed patterns under extremely reduced σ illumination", Proc. SPIE Vol. 3679, (1999), pp. 358–367.

In this method aberration is measured by forming a pattern using a photomask as described in the following Reference 2. In the following, this measurement method is described.

Reference 2: H. Nomura et al., "Overlay Error due to Lens Coma and Asymmetric Illumination Dependence on Pattern Feature", Proc. SPIE Vol. 3332, pp. 199–210.

FIGS. 17A, 17B and 17C are views showing the configurations of the pattern of the photomask that is used for the aberration measurement method described in the above reference and the pattern for aberration measurement. In addition, FIGS. 18A to 18F are schematic cross sectional views showing the formation method for the pattern for aberration measurement described in the above Reference 2 in process order.

Referring to FIG. 18A, first, a wafer 121 is prepared wherein a photoresist 121b is applied to a semiconductor substrate 121a.

Referring to FIG. 18B, the pattern of a photomask 105A, shown in FIG. 17A, is exposed to photoresist 121b of wafer 121. Through this first exposure, photoresist 121b is selectively exposed to light. Here, the portions of photoresist 121b that are exposed to light are shown as white areas while the portions that are not exposed to light are shown as diagonally hatched areas going from the upper left to the lower right.

Referring to FIG. 18C, the pattern of a photomask 105B, shown in FIG. 17B, is further exposed to photoresist 121b. Through this second exposure photoresist 121b is selectively exposed to light. Here, the portions of photoresist 121b that are not exposed to this exposure light are shown as diagonally hatched areas going from the upper right to the lower left. FIG. 18D is an enlarged view showing the region R1 while FIG. 18E is an enlarged view showing the region R2.

After this, photoresist 121b is developed and, then, only the regions (regions shown by cross hatching) that are not exposed to the exposure light through the first and second exposures remain so as to form resist pattern 121b as shown in FIG. 18F. This resist pattern 121b has a form as shown in FIG. 17C as represented in a plane manner.

Here, FIG. 18F corresponds to the cross sectional view along line XVIII—XVIII of FIG. 17C.

Thus, only a portion of the line and space pattern (L/S pattern) is extracted by eliminating the portions other than the L/S pattern portion through a double exposure according to a conventional method. The relative movement amount between the extracted L/S pattern and the formed pattern of large dimensions is measured with respect to many L/S patterns of which the pitch and the direction differ so that an odd aberration is found from the change in the pitch of this movement amount.

In addition, an even aberration is found from change in the pitch and the direction of the optimal focus after finding the optimal focus from the range of the resolution focus with respect to a large number of L/S patterns of which the pitch and direction differ.

According to this method, however, it is necessary to carry out a very large number of measurements, as shown in FIGS. 4 and 5 of Reference 1, in order to find the lens aberration in projection optical system and there is a problem wherein a great deal of labor and effort are required.

In addition, it is necessary to carry out the exposure by reducing the aperture size of the iris for the detection of the movement amount the optimal focus of the pattern, of which the pitch is large, and there is also a problem wherein a great deal of labor and effort are required for the exposure.

In addition, it is necessary to carry out the exposure by greatly reducing the aperture size of the iris in order to find the aberration in the vicinity of the center part of the iris and there is also a problem wherein this cannot be implemented by means of a commercially available exposure unit.

In addition, a large mask region becomes necessary since a large number of pattern types are used in order to carry out the measurement at a specific field point so that the inside of the field cannot be examined in detail. Concretely, there is a problem wherein the measurement can only be carried out to the degree wherein 8 mm is divided into three portions as shown in FIG. 3 of Reference 1.

SUMMARY OF THE INVENTION

It is an object of the present invention to provide a photomask for aberration measurement, an aberration measurement method, a unit for aberration measurement and a manufacturing method for the unit that can measure the aberration of a lens that requires little labor and that ramifies the inside of the field.

A photomask for aberration measurement of the present invention is a photomask for aberration measurement for measuring a lens aberration in the projection optical system of an exposure unit and is provided with a substrate, a plurality of measurement patterns, a light blocking film and a plurality of reference patterns. The substrate allows the exposure light to pass through and has a measurement pattern formation region and a reference pattern formation region. The plurality of measurement patterns are formed in the measurement pattern formation region on the top surface of the substrate. The light blocking film is formed in the measurement pattern formation region on the rear surface of the substrate and has an aperture pattern on the rear surface of the substrate for substantially differentiating the respective incident angles of the exposure light that enters plurality of measurement patterns. The plurality of reference patterns are formed in the reference pattern formation region on the top surface of the substrate. The rear surface of the substrate in the reference pattern formation region is formed so that the respective incident angles of the exposure light that enters the plurality of reference patterns become substantially equal.

According to the photomask for aberration measurement of the present invention, the respective incident angles of the exposure light that enters the plurality of measurement patterns can be substantially differentiated by means of the aperture pattern on the rear surface of the photomask. Thereby, an image of each of the plurality of measurement patterns can be formed on the photosensitive material through light in the diagonal direction. The image of the measurement pattern that is formed through the incidence of light from the diagonal direction causes a positional shift on the surface of the photosensitive material in the case that there is an aberration in the projection lens. Therefore, the aberration of the projection lens can be measured by measuring the amount of positional shift of the transferred pattern that is formed by means of the image of this measurement pattern through the comparison of the transferred pattern with the reference pattern. Since the aberration of the projection lens can be simply measured in such a manner, measurement of the aberration requires less labor than in the prior art.

In addition, since the aberration can be measured for each of the measurement pattern formation regions, it is possible to measure the aberration with respect to a plurality of points within the field. Therefore, the distribution of the aberrations within the field can be comprehended in detail.

In the above described photomask for aberration measurement, ½ of the diameter of the aperture pattern on the rear surface of the photomask preferably satisfies $\sin(\phi) \leq (NA/M)/5$ wherein the scale down projection ratio is M, the numerical aperture is NA and the half angle of the angle of viewing the aperture pattern on the rear surface of the photomask from the point on the top surface of the substrate that is directly opposite to the center position of the aperture pattern on the rear surface of the photomask is $\phi$.

In the case that $\sin(\phi)$ exceeds $(NA/M)/5$ of the above description, the angle range $\phi$ of the illumination light becomes too wide so that it becomes difficult to detect the local characteristics of the iris.

In the above described photomask for aberration measurement, ½ of the dimension of each of the plurality of measurement patterns preferably satisfies $\sin(\zeta) \leq (NA/M)/5$ wherein the scale down projection ratio is M, the numerical aperture is NA and the half angle of the angle of viewing the above measurement pattern from the point on the rear surface of the substrate that is directly opposite to the center position of the measurement pattern is $\zeta$.

In the case that $\sin(\zeta)$ exceeds $(NA/M)/5$ of the above description, the dimension of the measurement pattern becomes too large so that the range of the iris that contributes to the image formation of the pattern becomes too large and the resolution within the iris in the phase difference measurement is lowered and the precision of the measurement of the aberration deteriorates.

In the above described photomask for aberration measurement, at least some of the plurality of measurement patterns are preferably positioned in the range of the viewing angle $2\alpha$ that satisfies $\sin(\alpha) \leq (NA/M) \times \sigma$ having the point on the top surface of the above substrate directly opposite to the center position of the aperture pattern on the rear surface of the photomask as the center wherein the scale down projection ratio is M, the numerical aperture is NA and the ratio of sine of the half angle of the spread angle of the illumination with which the rear surface of the mask is irradiated to sine of maximum incident angle of the conversion rays in the projection optical system, that is to say, NA is $\sigma$.

The portion within the above described range is illuminated from the aperture pattern on the rear surface of the photomask and, therefore, a measurement pattern can be illuminated in the case that this measurement pattern is positioned within this range.

The center position of each pattern of the plurality of reference patterns preferably has the same arrangement as the center position of each pattern of the plurality of measurement patterns in the above described photomask for aberration measurement.

Thereby, each of the plurality of reference patterns and each of the plurality of measurement patterns can be effectively overlapped through a shifted double exposure.

In the above described photomask for aberration measurement, a light blocking film preferably has apertures with a constant aperture ratio in the region of the rear surface of the substrate wherein the viewing angle $\beta$ made as viewed from the top surface of the substrate satisfies $\sin(\beta) \geq (NA/M) \times \sigma$ having the point on the rear surface of the substrate that is directly opposite to an arbitrary point in the region wherein the plurality of reference patterns are arranged as the center point wherein the scale down projection ratio is M and the numerical aperture is NA.

Thereby, the photomask can be formed so that the respective incident angles of the exposure light that enters the plurality of reference patterns become substantially equal.

In the above described photomask for aberration measurement, the aperture pattern formed in the measurement pattern formation region on the rear surface of the substrate for substantially differentiating the respective incident angles of the exposure light that enters the plurality of measurement patterns is preferably circular.

In the above described photomask for aberration measurement, the external form of each of the plurality of measurement patterns is preferably square.

A box pattern can, thus, be used as the measurement pattern.

In the above described photomask for aberration measurement, the external form of each of the plurality of reference patterns is preferably square.

A box pattern can, thus, be used as the reference pattern.

In the above described photomask for aberration measurement, each of the plurality of measurement patterns is preferably arranged on the dot that forms a tetragonal lattice wherein the viewing angle δ of ½ of the pitch P of the points that form the tetragonal lattice as viewed from the points on the rear surface side of the substrate that are directly opposite to the points that form the tetragonal lattice satisfies $\sin(\delta) \leq (NA/M)/5$ wherein the scale down projection ratio is M and the numerical aperture is NA.

Thereby, plurality of aperture patterns 2a for measurement can be arranged in a concentrated manner so that it becomes possible to measure the phase distribution within the iris at a high resolution, that is to say, it becomes possible to measure the aberration with a high precision.

In the above described photomask for aberration measurement, the pitch P of the points that form the tetragonal lattice preferably satisfies $P/M \geq 20$ μm wherein the scale down projection ratio is M.

In the case that P/M is smaller than 20 μm, the overlap inspection unit cannot recognize the transferred patterns that correspond to two adjacent aperture patterns 2a for measurement as differing patterns.

In the above described photomask for aberration measurement, the dimension $I_{b1}$ of the square satisfies $I_{b1}/M \geq 5$ μm wherein the scale down projection ratio is M.

In the case that the dimension $I_{b1}$ of the measurement pattern is small to the degree that the above condition is not satisfied, the overlap inspection unit cannot measure the transferred pattern of the measurement pattern.

In the above described photomask for aberration measurement, the dimension $I_{b2}$ of the square satisfies $I_{b2}/M \geq 5$ μm wherein the scale down projection ratio is M.

In the case that the dimension $I_{b2}$ of the reference pattern is small to the degree that the above condition is not satisfied, the overlap inspection unit cannot measure the transferred pattern of the reference pattern.

In the above described photomask for aberration measurement, preferably, either one of the measurement pattern or the reference pattern corresponds to an inner box pattern of a box-in-box type mark while the other of the measurement pattern or the reference pattern corresponds to an outer box pattern.

Thereby, the amount of positional shift can be easily measured.

An aberration measurement method according to the present invention is provided with the step of transferring a plurality of measurement patterns of the above described photomask for aberration measurement onto a photosensitive material, the step of measuring the amount of positional shift of the transferred patterns and the step of calculating the inclination of the equiphase wave surface that is theoretically proportional to the amount of positional phase so as to find the wave aberration by using the information of the calculated inclination of the equiphase wave surface.

According to the aberration measurement method of the present invention, the respective incident angles of the exposure light to the plurality of measurement patterns can be made to differ substantially by means of an aperture patterns on the rear surface of the photomask. Thereby, an image of each of the plurality of measurement patterns can be formed by light in the diagonal direction relative to the photosensitive material. An image of a measurement pattern that is formed by light that enters from the diagonal direction is formed in a shifted position on the surface of the photosensitive material in the case that there is an aberration in the projection lens. Therefore, the amount of positional shift of the transferred pattern formed through the image formation of this measurement pattern can be measured in comparison with the transferred pattern of the reference pattern and, thereby, the aberration of the projection lens can be measured. The aberration of the projection lens can easily be measured in the above manner and, therefore, the aberration can be measured requiring less labor than in the prior art.

In addition, the aberration can be measured for each of the plurality of measurement pattern formation regions and, therefore, measurements of lens aberrations in a projection optical system are possible with respect to a large number of points within the field. Accordingly, the distribution of the lens aberration in the projection optical system can be found in detail within the field.

In the above described aberration measurement method, the step of measuring the amount of positional shift of the transferred pattern has the step of measuring the amount of mutual positional shift between the transferred pattern of the measurement pattern that has been transferred to the photosensitive material through either one of the first or second exposure and the transferred pattern of the reference pattern that has been transferred to the photosensitive material through the other of the first or second exposure by carrying out the second exposure with the photosensitive material being shifted relative to the photomask for aberration measurement after carrying out the first exposure by using the photomask for aberration measurement.

By carrying out a double exposure in such a manner, the amount of mutual positional shift between the transferred pattern of the measurement pattern and the transferred pattern of the reference pattern can be easily measured.

In the above described aberration measurement method, the step of measuring the amount of positional shift of the transferred pattern preferably has the step of measuring the amount of positional shift of the transferred pattern relative to the standard of a coordinate measurement unit by using the coordinate measurement unit.

Thereby, limitations of the form of the pattern for measuring the positional shift are reduced so that the freedom of formation design becomes high.

In the above described aberration measurement method, the coordinate measurement unit is preferably a projection exposure unit.

Thereby, the limitation of the formation of the pattern for measuring the positional shift is reduced so that the freedom of the formation design becomes high and it becomes unnecessary to separately prepare the coordination measurement unit.

In the above described aberration measurement method, preferably either one of the transferred pattern of the measurement pattern and the transferred pattern of the reference pattern is an inner box pattern of the box-in-box type mark while the other is an outer box pattern, wherein the amount of positional shift between the inner box pattern and the outer box pattern is measured by an overlap inspection unit.

Thereby, measurement of the amount of positional shift of overlapping becomes easy.

The above described aberration measurement method is preferably further provided with the steps of measuring the phase distribution within the iris of each focus when a plurality of measurement patterns are transferred to a photosensitive material with the focus being varied, of calculating the phase distribution within the iris at the time of defocusing with the standard of the phase distribution within the iris at the time of the optimal focus and of specifying the position of the iris center by finding the center of the paraboloid of revolution that represents the change of the phase distribution within the iris through defocusing.

Thereby, the positional shift between the aperture pattern on the rear surface of the photomask and the measurement pattern can be corrected so that a lens aberration measurement in the projection optical system with a high precision becomes possible.

A unit for aberration measurement of the present invention is a unit for aberration measurement that is provided with a photomask for aberration measurement for measuring a lens aberration in a projection optical system of an exposure unit, which is provided with a photomask for aberration measurement on which patterns are formed, an illumination optical system for irradiating the photomask for aberration measurement with exposure light and a projection optical system for projecting an image of the patterns of the photomask for aberration measurement onto a photosensitive material. The photomask for aberration measurement is provided with a substrate, plurality of measurement patterns, a light blocking film and a plurality of reference patterns. The plurality of measurement patterns is formed on the top surface of the substrate in a measurement pattern formation region. The light blocking film is formed on the rear surface of the substrate in a measurement pattern formation region and has a rear surface aperture pattern for substantially differentiating the respective incident angles of the exposure light that enters the plurality of measurement patterns. The plurality of reference patterns is formed on the top surface of the substrate in a reference pattern formation region. The rear surface of the substrate in the reference pattern formation region is formed so that the respective incident angles of the exposure light that enters the plurality of reference patterns become substantially the same.

According to the unit for aberration measurement of the present invention, the respective incident angles of the exposure light that enters each of the plurality of measurement patterns can be substantially differentiated by means of the rear surface aperture pattern. Thereby, an image of each of the plurality of measurement patterns can be formed by light in the diagonal direction relative to the photosensitive material. The image of the measurement pattern that is formed by light, which enters from the diagonal direction, is formed in a shifted position on the surface of the photosensitive material in the case that there is an aberration in the projection lens. Accordingly, the amount of positional shift of the transferred pattern formed through the image formation of this measurement pattern is measured as compared to the transferred pattern of the reference pattern and, thereby, the aberration of the projection lens can be measured. The aberration of the projection lens can be simply measured in such a manner and, therefore, the aberration can be measured with less labor than in the prior art.

In addition, since an aberration can be measured for each of the plurality of the measurement pattern regions, measurements of aberrations are possible at a large number of points within the field. Accordingly, the aberration distribution within the field can be found in detail.

A manufacturing method of a device according to the present invention uses the above described aberration measurement method.

Thereby, the distribution of the lens aberration within the field can be measured in detail while the measurement requires little labor and, therefore, the patterns that can be formed with a high precision can be known in advance so that the patterns of the device can be formed by exclusively using such patterns.

In the above described manufacturing method of a device, the device that is formed by using the aberration measurement method is a semiconductor device.

Though the above described manufacturing method of a device is suitable for the manufacture of devices (electronic devices) such as a thin film magnetic head or a liquid crystal display element, it is also suitable for the manufacture of a semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B are a schematic cross sectional view and a plan view for describing in detail the appearance of the measurement of the amount of positional shift in the aberration measurement method according to the first embodiment of the present invention;

DESCRIPTION OF THE PREFERRED EMBODIMENTS

In the following, the embodiments of the present invention are described in reference to the drawings.
First Embodiment First, the principle of an aberration measurement method of the present embodiment is described.

Figure 1:
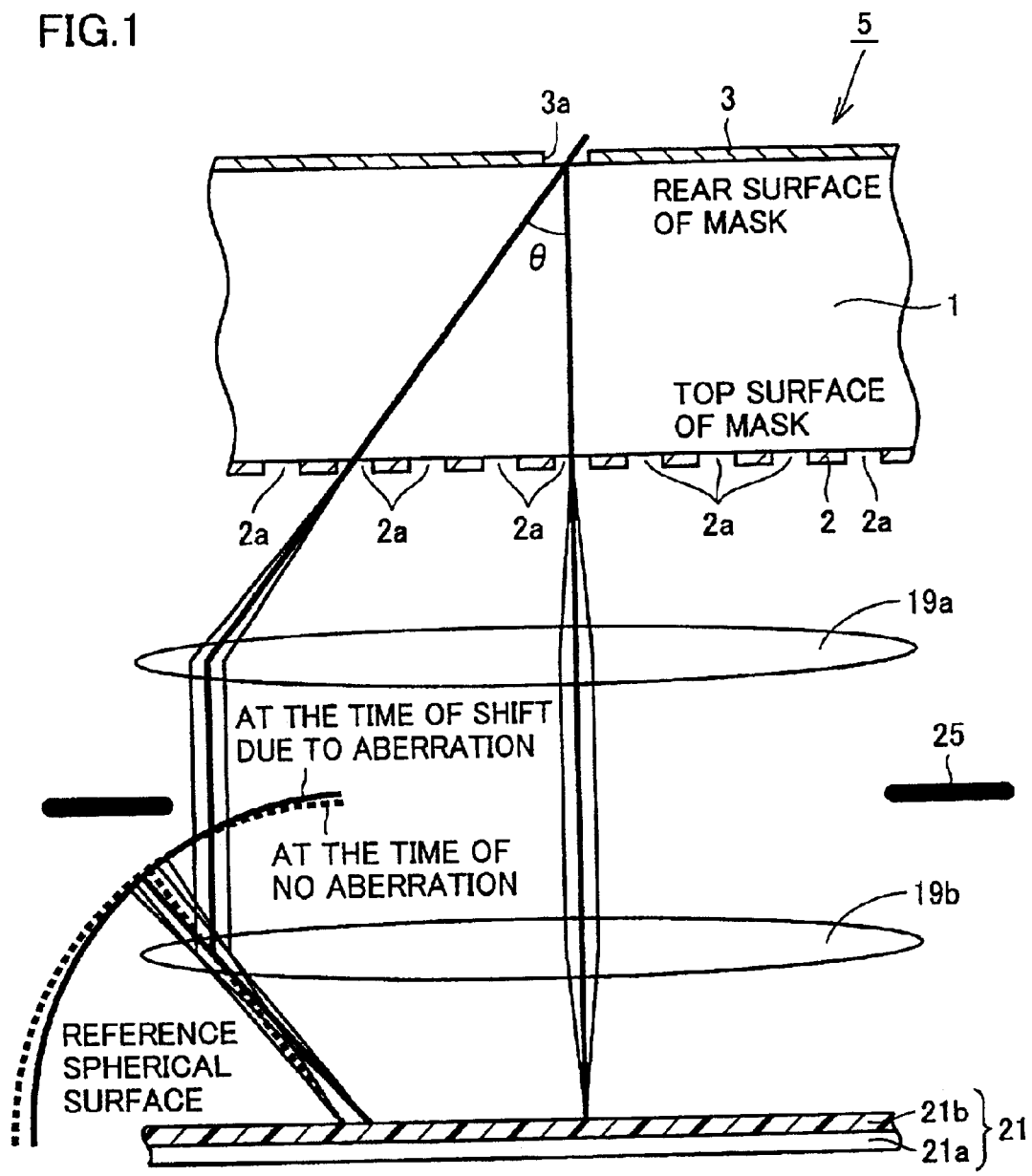
FIG. 1 is a view for describing the principle of an aberration measurement method according to a first embodiment of the present invention.

Referring to FIG. 1, a photomask 5 that is used in a focus monitoring method of the present embodiment has a substrate 1 for allowing the exposure light to pass through, a light blocking film 2 that has a plurality of aperture patterns 2a for measurement formed on the top surface of substrate 1, a light blocking film 3 that has a rear surface aperture pattern 3a formed on the rear surface of substrate 1.

One rear surface aperture pattern 3a is provided so as to be shared by a plurality of aperture pattern 2a for measurement and is formed and arranged so as to substantially differentiate the respective incident angles of the exposure light to the plurality of aperture patterns 2a for measurement.

In the aberration measurement, first, the rear surface of photomask 5 is irradiated with exposure light. The exposure light passes through rear surface aperture pattern 3a and each of the plurality of aperture patterns 2a for measurement is irradiated with the exposure light from a different incident angle. After this, the diffraction light that is diffracted by each of the plurality of aperture patterns 2a for measurement passes through a projection lens 19a, an iris 25 and a projection lens 19b in this order so as to form an image on a photosensitive material (photoresist) 21b on a semiconductor substrate 21a.

At this time, in the case that there is an aberration in projection lens 19a or 19b, an image of aperture patterns 2a for measurement that is formed by light that enters from the diagonal direction relative to photoresist 21b is formed in a shifted position from the position of the case where there is no aberration on the surface of photoresist 21b. In the figure, the appearance of the image formed in the shifted position due to the aberration is shown by a solid line while the appearance of the image formed at the time when there is no aberration is shown by a dotted line. The aberration of projection lens 19a or 19b can be measured by measuring the amount of positional shift of the transferred patterns of these aperture patterns 2a for measurement.

One set of box patterns of approximately 30 $\mu$m (this is referred to as measurement pattern region) that are arranged in a lattice form in a range of approximately 2000 $\mu$m with a pitch of, for example, approximately 100 $\mu$m is provided on the surface of photomask 5 as aperture patterns 2a for measurement so that a lens aberration (phase error distribution within the iris) as seen from a certain field point is measured. In addition, a large number of such measurement pattern regions are arranged within the exposure field and thereby it becomes possible to measure a lens aberration at each point in the exposure field.

Accordingly, a phase error can be measured for each of the plurality of aperture patterns 2a for measurement in this photomask 5 and, therefore, the distribution of the phase errors in respective positions of the iris, that is to say, aberration can be gained.

Thus, in the present embodiment, the step of measuring the aberration of projection lens 19a, 19b can be reduced in comparison with the prior art so that the aberration can be measured requiring little labor.

In addition, the measurement of the aberration of a great number of points within the field is possible and, therefore, the aberration distribution within the field can be grasped in detail.

Next, the configuration of a photomask used in an aberration measurement method according to the present embodiment is concretely described.

Figure 2:
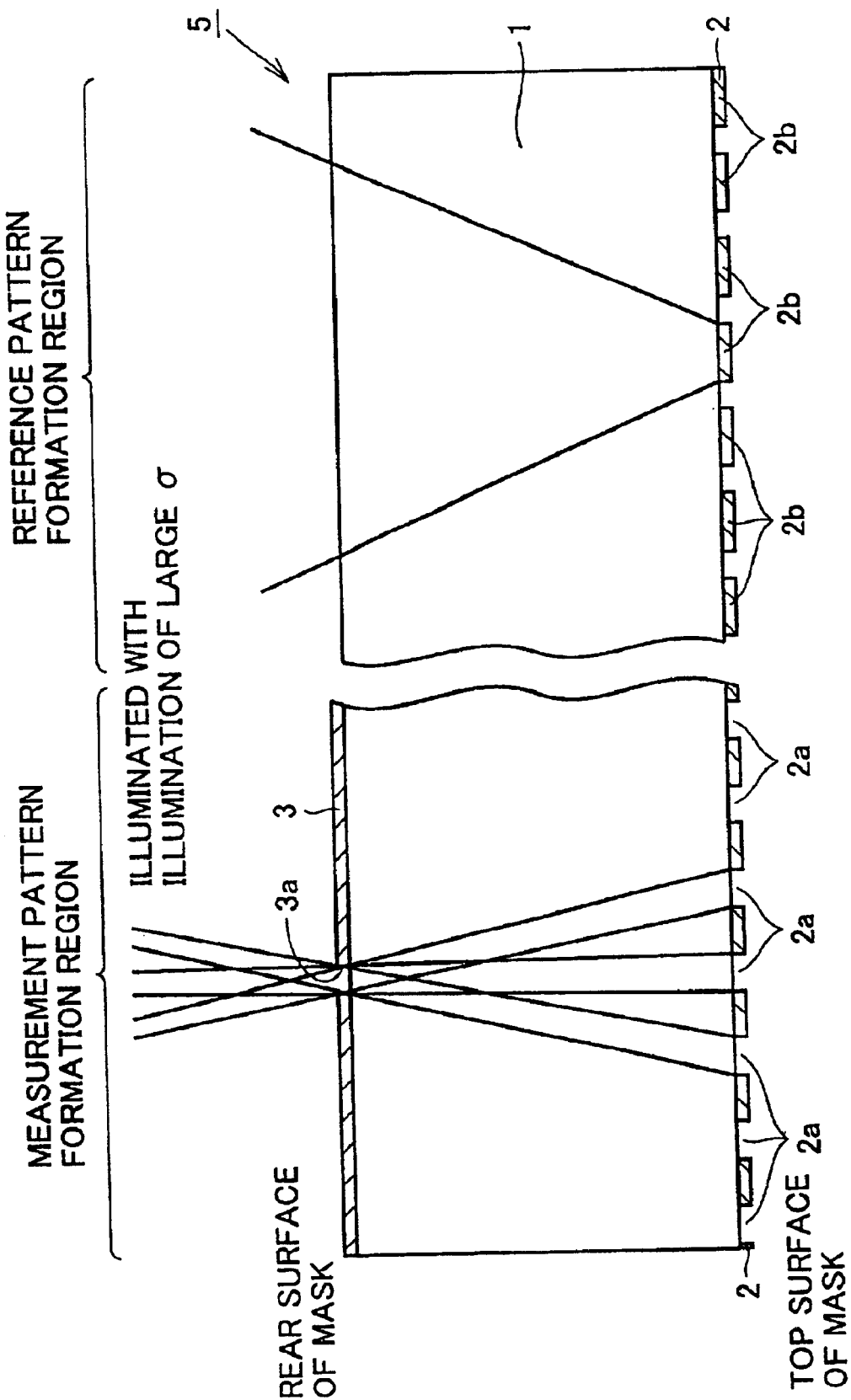
FIG. 2 is a cross sectional view schematically showing the configuration of a photomask used in the aberration measurement method according to the first embodiment of the present invention.

Referring to FIG. 2, this photomask 5 has a measurement pattern formation region and a reference pattern formation region. In the measurement pattern formation region, as described above, a plurality of aperture patterns 2a for measurement are formed on the top surface of substrate 1 and rear surface aperture patterns 3a are formed on the rear surface respectively.

Figure 3:
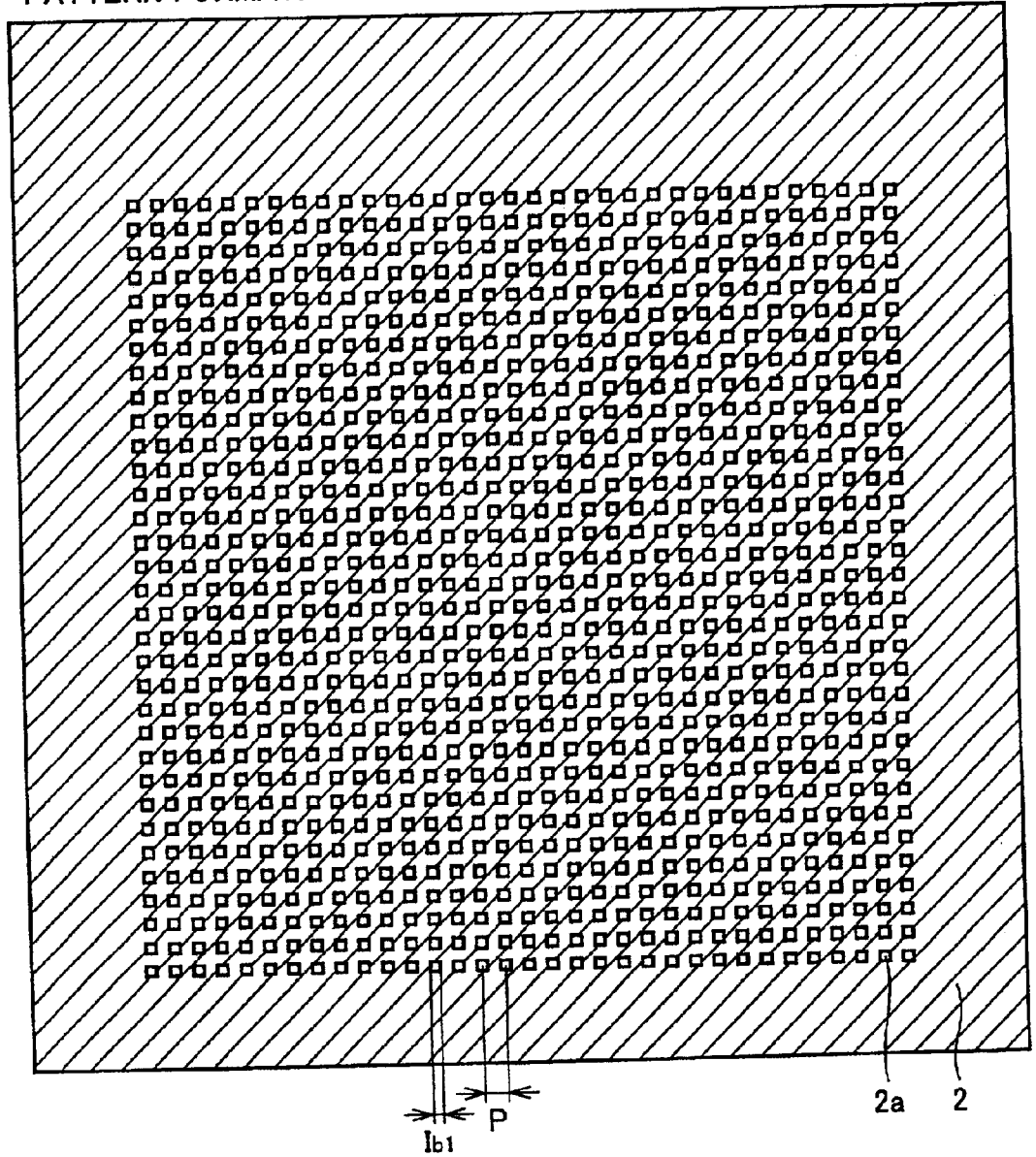
FIG. 3 is a plan view schematically showing the top surface of a measurement pattern formation region of the photomask used in the aberration measurement method according to the first embodiment of the present invention.
Figure 4:
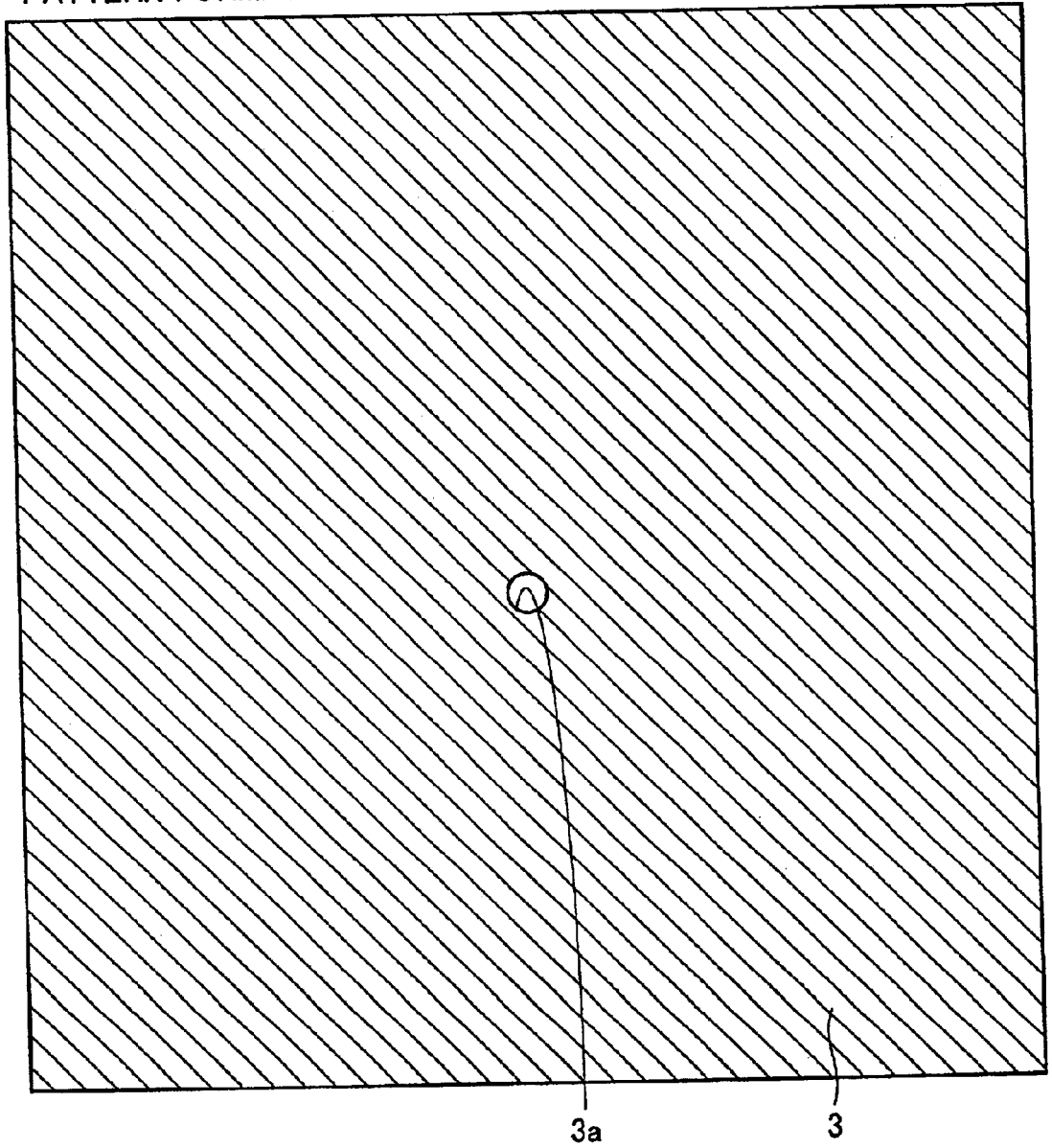
FIG. 4 is a plan view schematically showing the rear surface of the measurement pattern formation region of the photomask used in the aberration measurement method according to the first embodiment of the present invention.

The plurality of aperture patterns 2a for measurement is arranged in a square lattice form as shown in, for example, FIG. 3. That is to say, the central position of each of the plurality of aperture patterns 2a for measurement is arranged at a point that forms a tetragonal lattice (tetragonal lattice point). In addition, the rear surface aperture patterns 3a are provided, for example, in a circular form, so that one of them is shared by a plurality of aperture patterns 2a for measurement as shown, for example, in FIG. 4.

Figure 5:
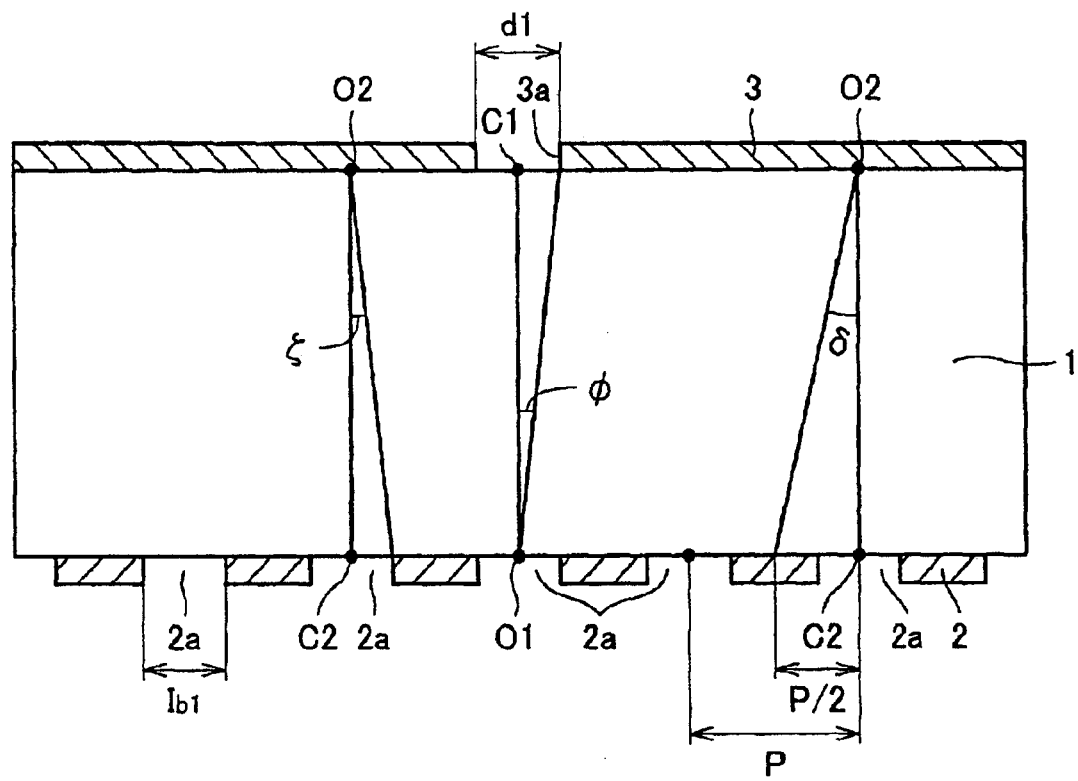
FIG. 5 is a schematic cross sectional view showing an enlarged measurement pattern formation region of the photomask used in the aberration measurement method according to the first embodiment of the present invention.

Referring to FIG. 5, ½ (radius) of the diameter dimension d1 of rear surface aperture pattern 3a preferably satisfies $\sin(\phi) \leq (NA/M)/5$ where the scale down projection ratio is M, the numerical aperture is NA, the half angle of the viewing angle of rear surface aperture pattern 3a as seen from point O1 on the top surface of substrate 1 that is directly opposite to the center position C1 of rear surface aperture pattern 3a is $\phi$. It is necessary to allow the angle range $\phi$ of illumination light to be narrow in order to detect the property of the iris locally. In the case that $\sin(\phi)$ exceeds $(NA/M)/5$ the angle range $\phi$ of the illumination light becomes too wide so that it becomes difficult to detect the property of the iris locally. It is preferable for the above described projection magnification M to be 4.

In addition, ½ of the dimension $I_{b1}$ of each of the plurality of aperture patterns 2a for measurement preferably satisfies $\sin(\zeta) \leq (NA/M)/5$ where the half angle of a viewing angle of aperture pattern 2a for measurement as seen from point O2 on the rear surface of substrate 1 that is directly opposite to the central position C2 of aperture pattern 2a for measurement is $\zeta$. In the case that $\sin(\zeta)$ exceeds $(NA/M)/5$ the dimension of the measurement pattern becomes too large so that the range of the iris that contributes to the image formation of the pattern becomes large, the resolution within the iris is lowered in the phase difference measurement and the precision of the measured aberration is deteriorated. It is preferable for the above described projection magnification M to be 4 and it is preferable for the numerical aperture NA to be 0.7.

In addition, each of the plurality of aperture patterns 2a for measurement is arranged at a point that form a tetragonal lattice and it is preferable for a viewing angle $\delta$ of ½ of the pitch P of the points that form the tetragonal lattice as shown in FIG. 3 as seen from point O2 on the rear surface of substrate 1 that is directly opposite to a tetragonal lattice point C2 as shown in FIG. 5 to satisfy $\sin(\delta) \leq (NA/M)/5$. Thereby, plurality of aperture patterns 2a for measurement can be arranged in a concentrated manner.

In addition, it is preferable for the pitch P of the tetragonal lattice points to satisfy $P/M \geq 20$ $\mu$m. In the case that P/M is smaller than 20 $\mu$m, an overlap inspection unit can not recognize the transferred patterns that correspond to the two adjoining aperture patterns 2a for measurement as two separate patterns.

Figure 6:
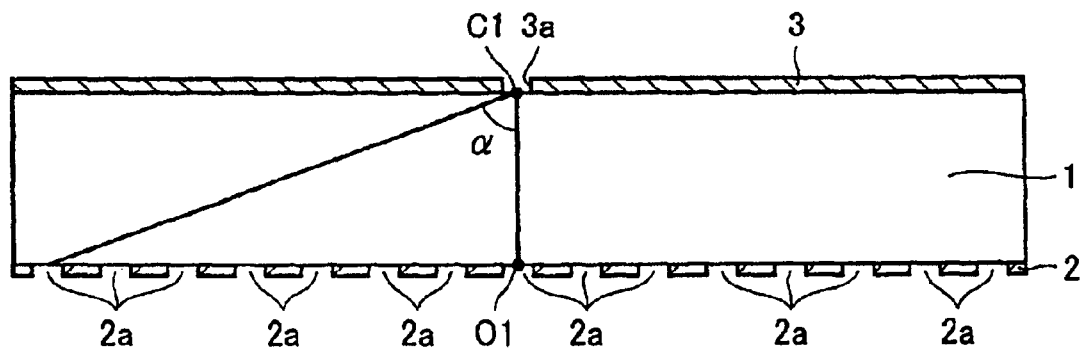
FIG. 6 is a schematic cross sectional view showing an enlarged measurement pattern formation region of the photomask used in the aberration measurement method according to the first embodiment of the present invention.

Referring to FIG. 6, it is preferable for some of the plurality of aperture patterns 2a for measurement to be positioned within the range of the viewing angle 2$\alpha$ that satisfies $\sin(\alpha) \leq (NA/M) \times \sigma$ where the angular spread of illumination is $\sigma$ and the center of the viewing angle is point O1 on the top surface of substrate 1 that is directly opposite to the center position C1 of the rear surface aperture pattern 3a. The above described range can be illuminated from rear surface aperture pattern 3a and, therefore, aperture pattern 2a for measurement can be illuminated in the case that this aperture pattern 2a for measurement is located within this range.

Referring to FIG. 2, a plurality of reference patterns 2b formed of a light blocking film 2 on the top surface of a substrate 1 is formed in the reference pattern formation region. In addition, the rear surface of substrate 1 is formed so that the respective incident angles of the exposure light to each of the plurality of reference patterns 2b become substantially the same and concretely a light blocking film for blocking the entrance of exposure light to each of the plurality of reference patterns 2b is not formed.

Figure 7:
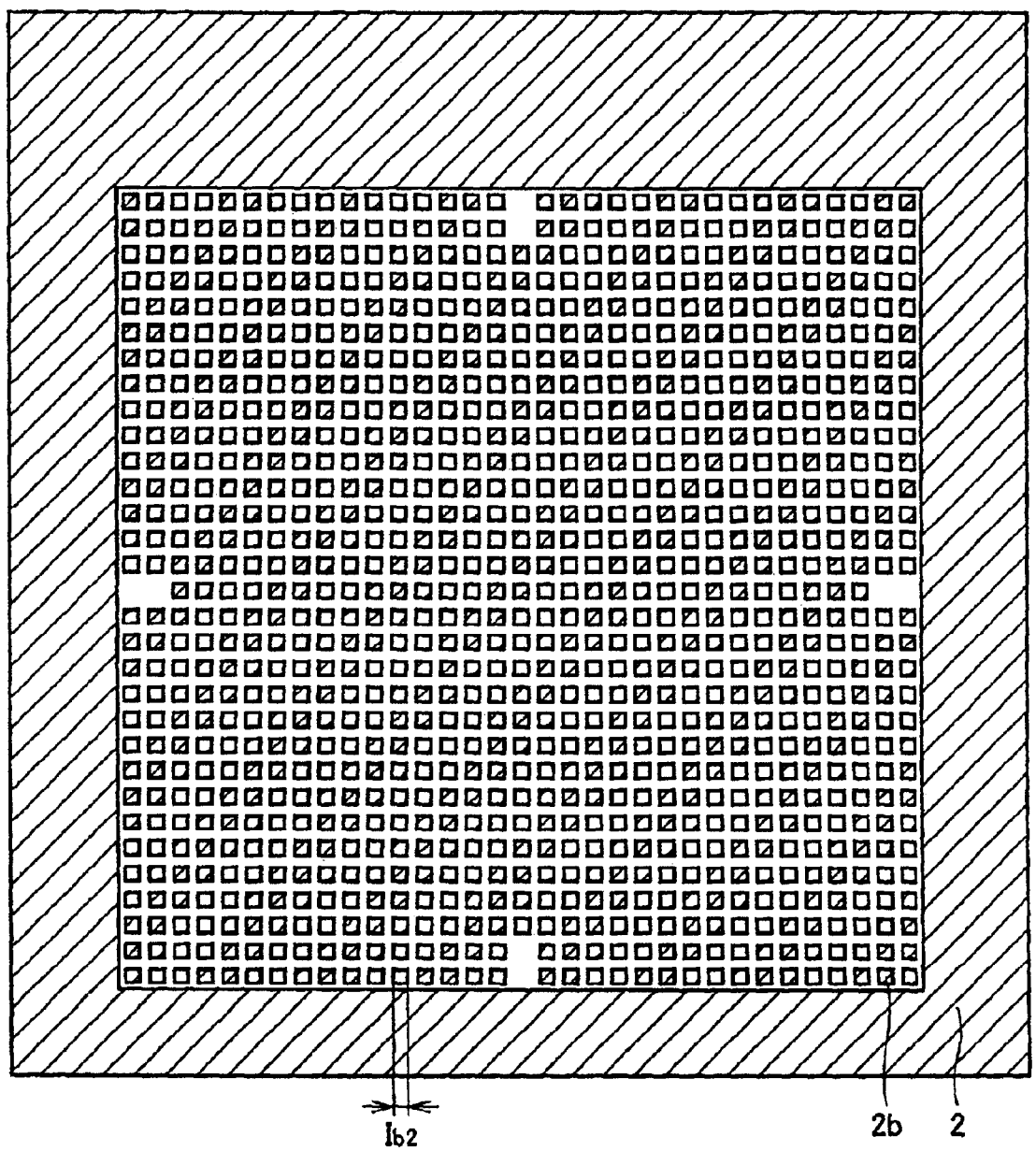
FIG. 7 is a plan view schematically showing the surface of a reference pattern formation region of the photomask used in the aberration measurement method according to the first embodiment of the present invention.

Plurality of reference patterns 2b is arranged in a tetragonal lattice form, for example, as shown in FIG. 7. That is to say, the center position of each of the plurality of reference patterns 2b is arranged at a tetragonal lattice point. In addition, the center position of each pattern of the plurality of reference patterns 2b that are arranged at tetragonal lattice points has the same arrangement as the center position of each pattern of the plurality of aperture patterns 2a for measurement that are arranged at tetragonal lattice points. Therefore, in the case that plurality of reference patterns 2b is overlapped with plurality of aperture patterns 2a for measurement, the center position of each pattern of plurality of reference patterns 2b agrees with the center position of each pattern of plurality of aperture patterns 2a for measurement.

Figure 8:
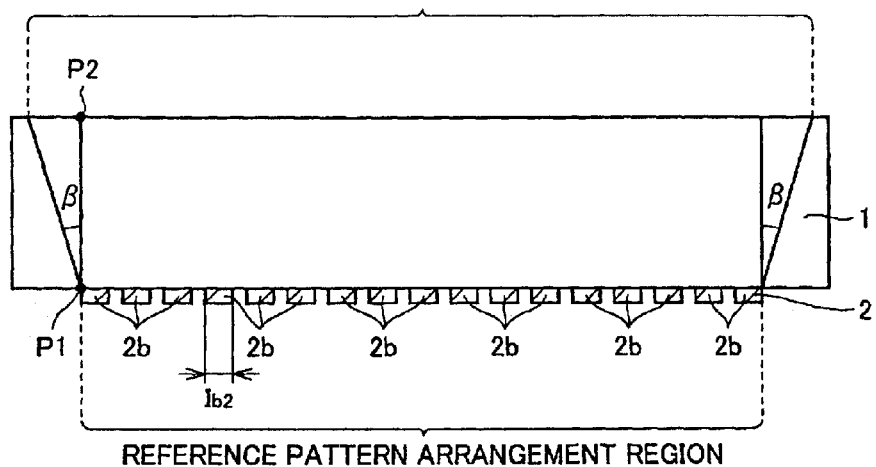
FIG. 8 is a schematic cross sectional view showing an enlarged reference pattern formation region of the photomask used in the aberration measurement method according to the first embodiment of the present invention.

Referring to FIG. 8, a light blocking film does not exist within a range wherein a viewing angle $\beta$ seen from the top surface of substrate 1 satisfies $\sin(\beta) \geq (NA/M) \times \sigma$ having point P2 on the rear surface of substrate 1 that is directly opposite to an arbitrary point P1 within the reference pattern arrangement region where plurality of reference patterns 2b are arranged. Thereby, a light blocking film can be prevented from blocking the entrance of exposure light to reference patterns 2b.

Here, a reference pattern 2b can be irradiated with exposure light as long as it has an aperture of a constant aperture ratio within the range that satisfies the above described $\sin(\beta) \geq (NA/M) \times \sigma$ and, therefore, a semi-light blocking film or the like may be formed on the rear surface of substrate 1 within this range.

Here, it is preferable for the external form of each of the plurality of aperture patterns 2a for measurement to be a square and it is preferable for the external form of each of the plurality of reference patterns 2b to be a square. In addition, it is preferable for the dimension $I_{b1}$ (FIGS. 3, 5) in a square form of aperture pattern 2a for measurement to satisfy $I_{b1}/M \geq 5$ $\mu$m and it is preferable for the dimension $I_{b2}$ (FIGS. 7, 8) in a square form of reference pattern 2b to satisfy $I_{b2}/M \geq 5$ $\mu$m. In the case that the dimension $I_{b1}$, $I_{b2}$ of each of aperture pattern 2a for measurement and reference pattern 2b is small to a degree that does not satisfy the above described condition, the overlap inspection unit can not measure each of the transferred patterns of aperture pattern 2a for measurement and reference pattern 2b.

Preferably either one of aperture pattern 2a for measurement and reference pattern 2b corresponds to an inner box pattern of the box-in-box type mark while the other of aperture pattern 2a for measurement and reference pattern 2b corresponds to an outer box pattern.

Here, in the above description, "is directly opposite to" means a point on the top surface of substrate 1 and a point on the rear surface face each other in the direction of the optical axis.

Next, the configuration of a unit for aberration measurement used for the aberration measurement method according to the present embodiment is concretely described.

Figure 9:
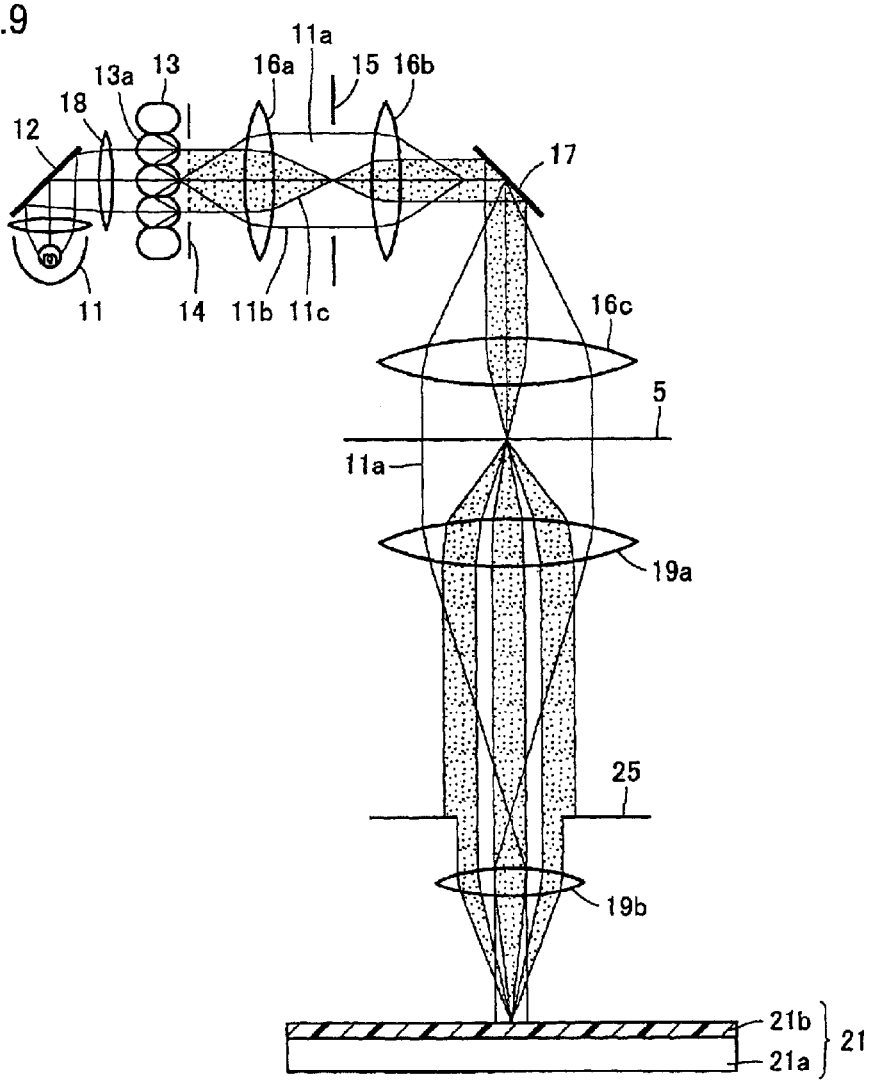
FIG. 9 is a schematic view showing the configuration of a unit for aberration measurement used in the aberration measurement method according to the first embodiment of the present invention.

Referring to FIG. 9, this unit for aberration measurement has a configuration similar to that of a scale down projection exposure unit (stepper) and scales down a pattern on photomask 5 and project the pattern onto photoresist 21b on the surface of wafer 21. This unit for focus monitoring has an illumination optical system for a light path starting from light source 11 and finishing at the pattern of photomask 5 and a projection optical system for a light path starting from the pattern of photomask 5 and finishing at wafer 21.

The illumination optical system has a mercury lamp 11 that is a light source, a reflecting mirror 12, a condenser lens 18, a fly eye lens 13, an iris 14, condenser lenses 16a, 16b, 16c, a blind iris 15 and a reflecting mirror 17. In addition, the projection optical system has projection lenses 19a, 19b and an iris 25.

In the exposure operation thereof, first, light 11a is emitted from mercury lamp 11 and, for example, only the g-string (wavelength: 436 nm) thereof reflects from reflecting mirror 12 so that light 11a becomes light of a single wavelength. Next, light 11a passes through condenser lens 18 and enters each of fly eye component lenses 13a in fly eye lens 13 and, after that, passes through iris 14.

Here, light 11b passes through a light path created by one fly eye component lens 13a while light 11c while light 11c passes through a light path created by fly eye lens 13.

Light 11a that has passed through iris 14 passes through condenser lens 16a, blind iris 15 and condenser lens 16b and, then, reflects at a predetermined angle from reflecting mirror 17.

The entirety of the surface of photomask 5 on which a predetermined pattern is formed is irradiated with light 11a reflected by reflecting mirror 17 after light 11a passes through condenser lens 16c. After this, light 11a exposes photoresist 21b on semiconductor substrate 21a, which is scaled down according to a predetermined ratio by projection lenses 19a, 19b.

Next, a concrete aberration measurement method according to the present embodiment is described.

Figure 10:
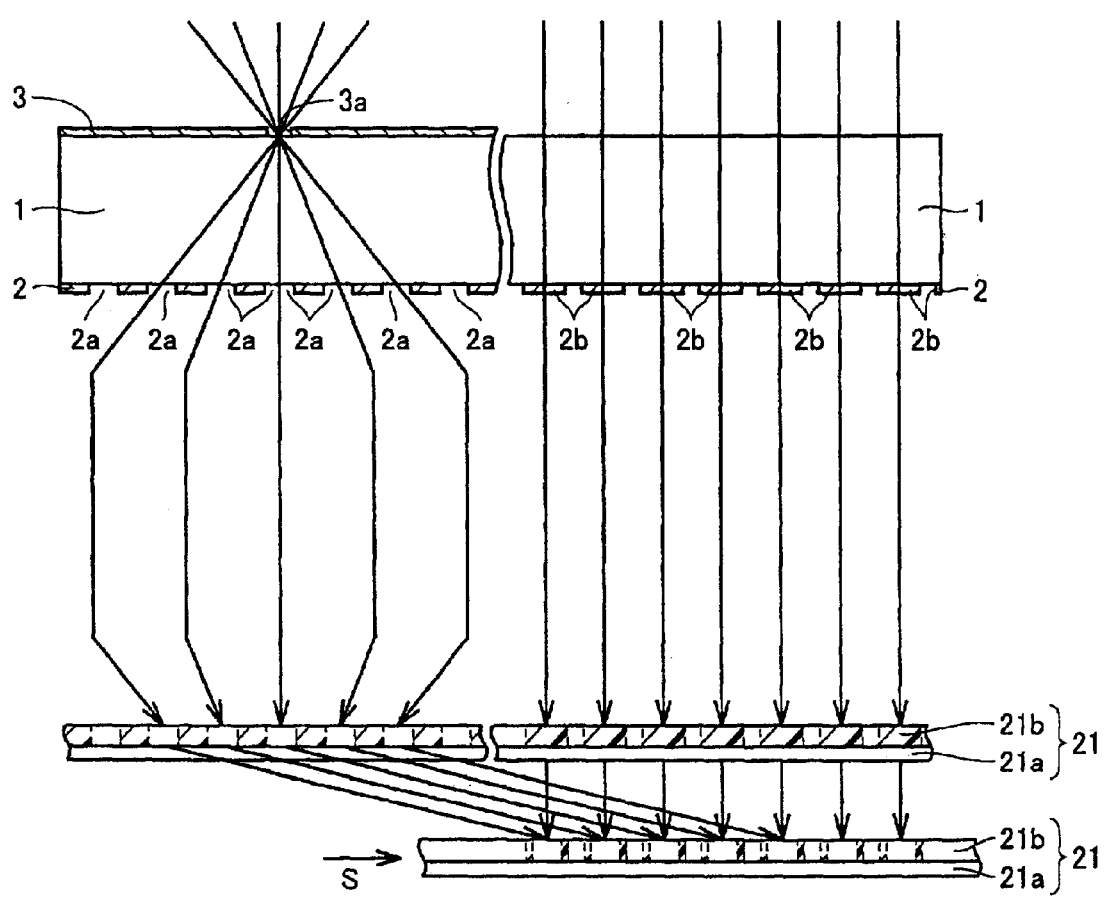
FIG. 10 is a schematic view for describing the appearance of a shifted double exposure in the aberration measurement method according to the first embodiment of the present invention.

Referring to FIG. 10, in an aberration measurement method of the present embodiment, the pattern of photomask 5 shown in FIGS. 2 to 8 is exposed to photoresist 21b by means of a unit for aberration measurement shown in FIG. 9. Through this exposure, aperture pattern 2a for measurement allows its image to be formed by diffraction light from the diagonal direction relative to the surface of photoresist 21b while reference pattern 2b allows its image to be formed by diffraction light from the direction perpendicular to the surface of photoresist 21b.

After this first exposure, wafer 21 is moved (shifted) in the direction of arrow s are in the x-y plane by means of an x-y stage so that a second exposure is carried out. This second exposure is carried out in the same manner as the first exposure and is carried out so that exposure regions of plurality of reference patterns 2b resulting from the second exposure overlap the respective exposure regions of plurality of aperture patterns 2a for measurement resulting from the first exposure. Through such a shifted double exposure, a box-in-box type mark pattern is exposed to photoresist 21b.

More concretely, through the first exposure, aperture pattern 2a for measurement that is an inner box pattern as shown in FIG. 1A is exposed to photoresist 21b. After this, wafer 21 is moved as described above. After this, through the second exposure, reference pattern 2b, which becomes an outer box pattern, is exposed to the region wherein aperture pattern 2a for measurement is exposed as shown in FIG. 11B.

After this, photoresist 21b is developed. Thereby, a box-in-box pattern, wherein inner box pattern 22 is located within outer box pattern 23 as shown in FIGS. 12A and 12B, is formed on photoresist 21b.

Here, a light beam for forming an optical image of inner box pattern 22 of the above described box-in-box enters photoresist 21b from the diagonal direction as shown in FIG. 10 while a light beam for forming an optical image of outer box pattern 23 enters photoresist 21b in a symmetric and isotropic manner relative to the optical axis. Therefore, inner box pattern 22 causes a positional shift due to the aberration while outer box pattern 23 does not cause a positional shift due to the aberration. Accordingly, in the case that there is an aberration in projection lens 19a, 19b, the position of inner box pattern 22 is shifted relative to the position of outer box pattern 23.

Here in FIG. 12B, the position of inner box pattern 22 is shown by a dotted line in the case that there is no aberration while the position of inner box pattern 22 is shown by a solid line in the case that there is an aberration.

Next, distances x1, x2 between inner box pattern 22 and outer box patter 23 formed in the above manner are measured by means of, for example, an overlap inspection unit (KLA). Distance x3(=(x1+x2)/2) between inner box pattern 22 and outer box pattern 23 in the case that there is no aberration is found from these values. The difference between this distance x3 and distance x1 or x2 can be found so as to gain the amount of lateral movement (amount of positional shift) of inner box pattern 22 and outer box pattern 23.

Since this amount of positional shift is proportional to the inclination of the equiphase wave surface, the inclination of the equiphase wave surface can be calculated from this amount of positional shift. Then, the phase distribution in comparison with the ideal optical system within the iris, that is to say, the wave surface aberration, can be found through a numerical value integral calculating process (line integral) by using this inclination of the equiphase wave surface. In addition, the wave surface aberrations with respect to a plurality of measurement pattern regions arranged within the exposure field are measured in the same manner and, thereby, the distribution of lens aberrations within the exposure field can be acquired.

Figure 11A:
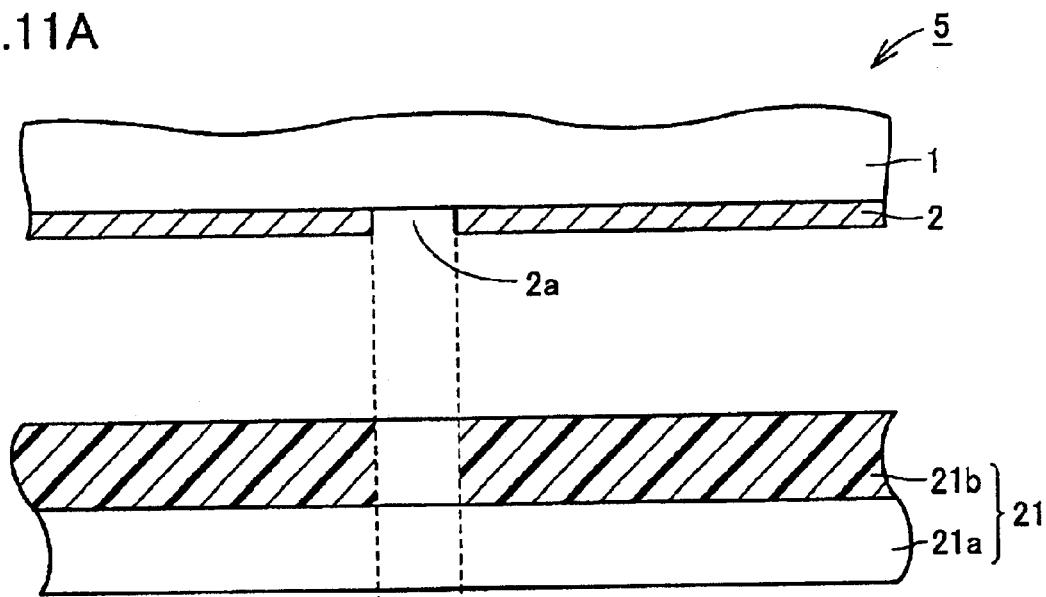
FIGS. 11A and 11B are schematic cross sectional views for describing in detail the appearance of a shifted double exposure in the aberration measurement method according to the first embodiment of the present invention.
Figure 11B:
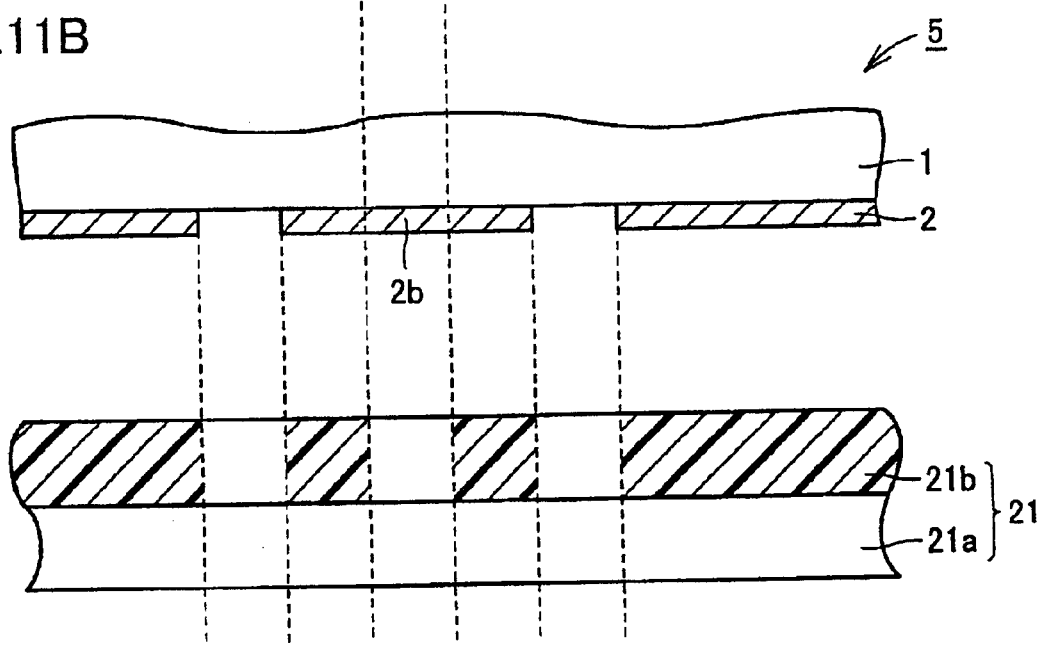

In addition, though the case wherein photoresist 21b is developed after a double exposure is described in FIGS. 11A and 11B, photoresist 21b may be patterned by repeating two times the step of developing after the exposure. That is to say, photoresist 21b may be patterned through the steps of first exposure→first development→movement of wafer 21→second exposure→second development.

Figure 13A:
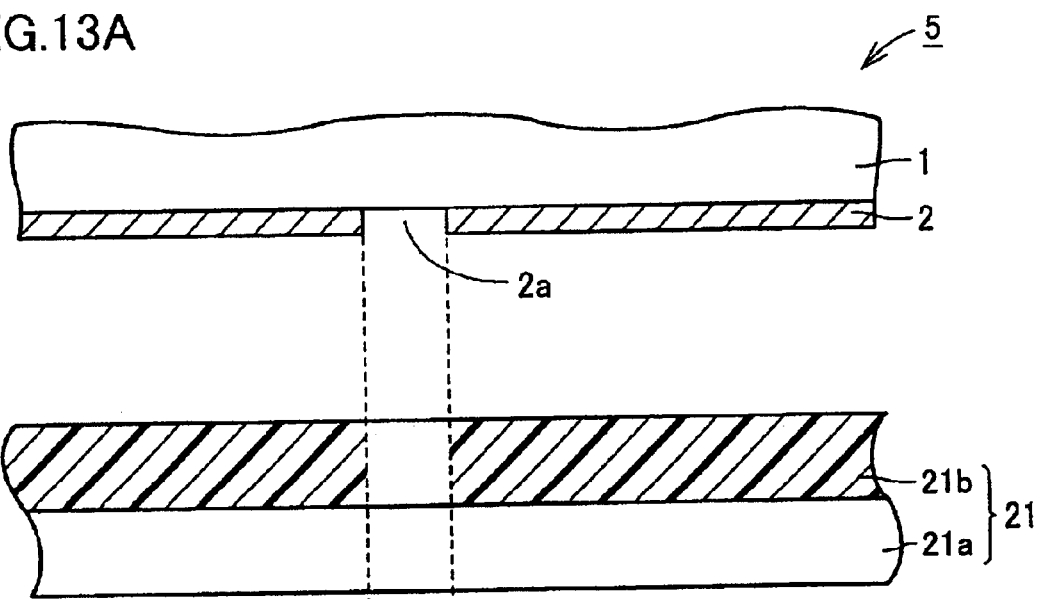
FIGS. 13A to 13C are schematic cross sectional views for describing in detail the appearance of repeating the exposure and the development two times in the aberration measurement method according to the first embodiment of the present invention.
Figure 13B:
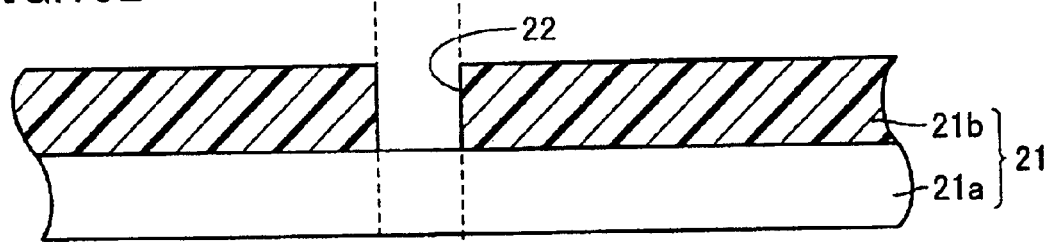
Figure 13C:
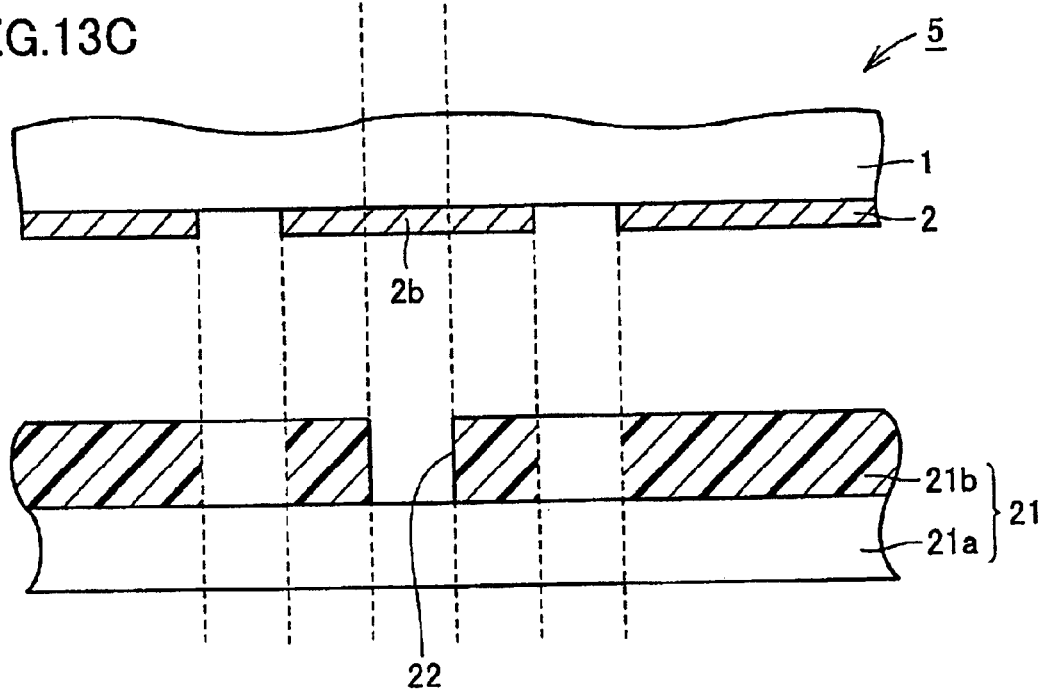

Referring to FIG. 13A, through the first exposure, aperture pattern 2a for measurement, which becomes an inner box pattern, is first exposed to photoresist 21b. After this, the first development is carried out. Thereby, inner box pattern 22 is formed in photoresist 21b as shown in FIG. 13B. Wafer 21 is moved in the lateral direction within the x-y plane under the condition wherein this inner box pattern 22 is formed. Then, as shown in FIG. 13C, the second exposure is carried out so that reference pattern 2b, which becomes an outer box pattern, is exposed after being overlapped on the region wherein inner box pattern 22 is formed. After this, by carrying out the second development on photoresist 21b, outer box pattern 23 is formed as shown in FIGS. 12A and 12B.

Next, a method for correcting the positioning error of wafer 21 when wafer 21 is moved between the above described first and second exposures is described.

It is necessary to move wafer 21 so that the pattern center of aperture pattern 2a for measurement at the time of the first exposure as seen from wafer 21 and the pattern center of reference pattern 2b at the time of the second exposure agree with each other in the shifted double exposure. In the present method, wherein an aberration is detected from the mutual positional shift between the above described inner box pattern 22 and outer box pattern 23, the shift due to an error of this amount of wafer movement is also recognized as an aberration so as to cause an error in the actual measurement of the aberration.

Therefore, an auxiliary pattern (not shown) for correcting the positioning error is formed on photomask 5 so that the positioning error is measured by using this auxiliary pattern. For example, the positioning error can be derived from the distance between the transferred pattern of the auxiliary pattern formed on the photoresist through the first exposure and the transferred pattern of the auxiliary pattern formed through the second exposure. After that, this positioning error is subtracted from the amount of positional shift and, thereby, the positioning error of wafer 21 can be corrected. In addition, the focus is changed to a plurality of points (at least two points) so that the phase distribution within the iris (distribution of wave surface aberration) is measured for each focus and, thereby, the phase distribution within the iris at the time of defocusing having the phase distribution within the iris at the position of the optimal focus can be calculated. The center of the paraboloid of revolution, which is the phase distribution within the iris at this time of defocusing, can be specified as the center position of iris.

Figure 14:
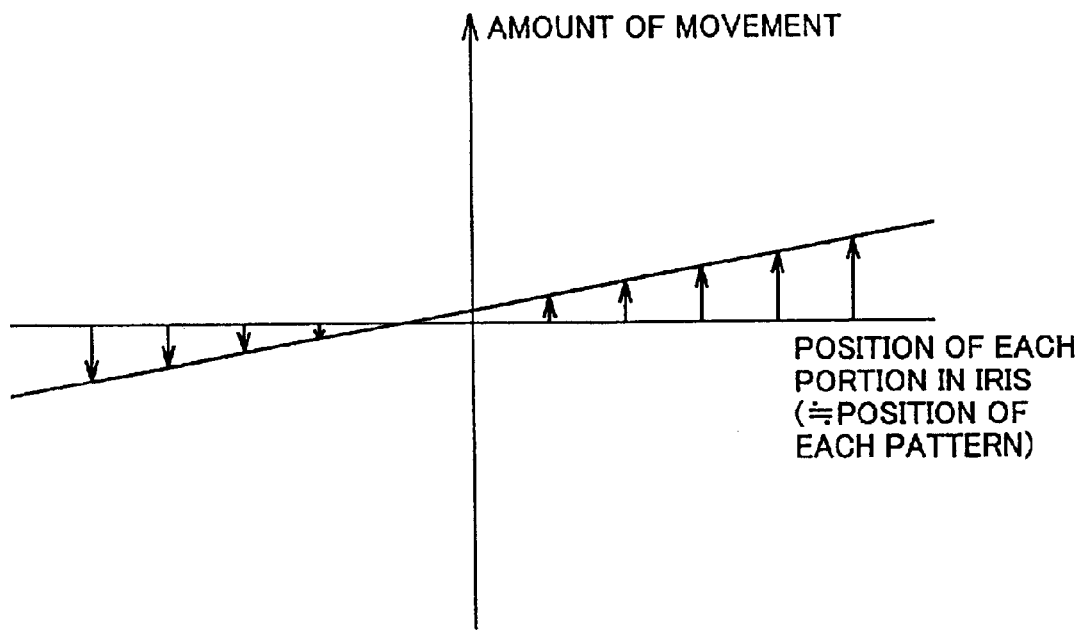
FIG. 14 is a diagram showing the relationship between the shift amount of the pattern and the position of each portion in the iris.

For example, in the case that a certain point within the iris is assumed to be the origin, the intersection between the line showing the change in the amount of movement and the lateral axis shifts from the origin as shown in FIG. 14 in the distribution of the amount of positional shift (amount of movement) in each position within the iris. In this case, since the phase is an integral value of the amount of movement, the distribution of the phase in each position within the iris becomes like the paraboloid of revolution shown in FIG. 15, wherein the intersection between the paraboloid of revolution and the lateral axis still shifts from the origin. Therefore, the center position (peak position) of this paraboloid of revolution is specified as the center position of the iris and, thereby, the positional shift between rear surface aperture pattern 3a and the aperture pattern for measurement can be corrected.

Figure 15:
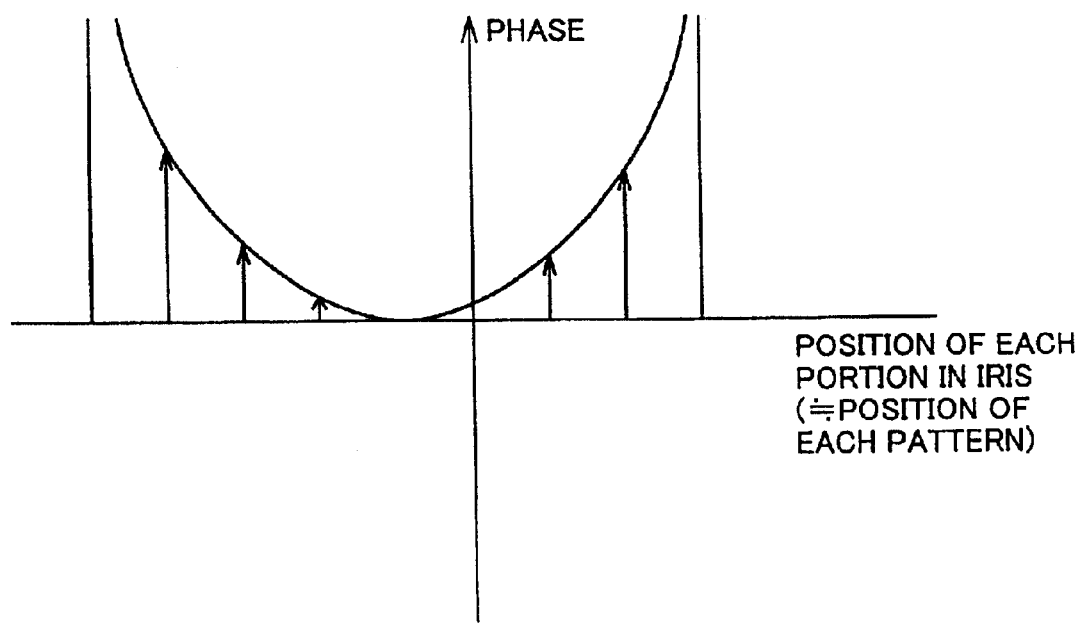
FIG. 15 is a diagram showing the relationship between the phase and the position of each portion in the iris.

Here, though in FIG. 15, since only the positions in a certain line form are measured within the iris, the phase distribution within the iris is represented by a parabola, in the case that the positions throughout the entirety within the plane of the iris are measured, the phase distribution within the iris becomes of the paraboloid of revolution.

Figure 16:
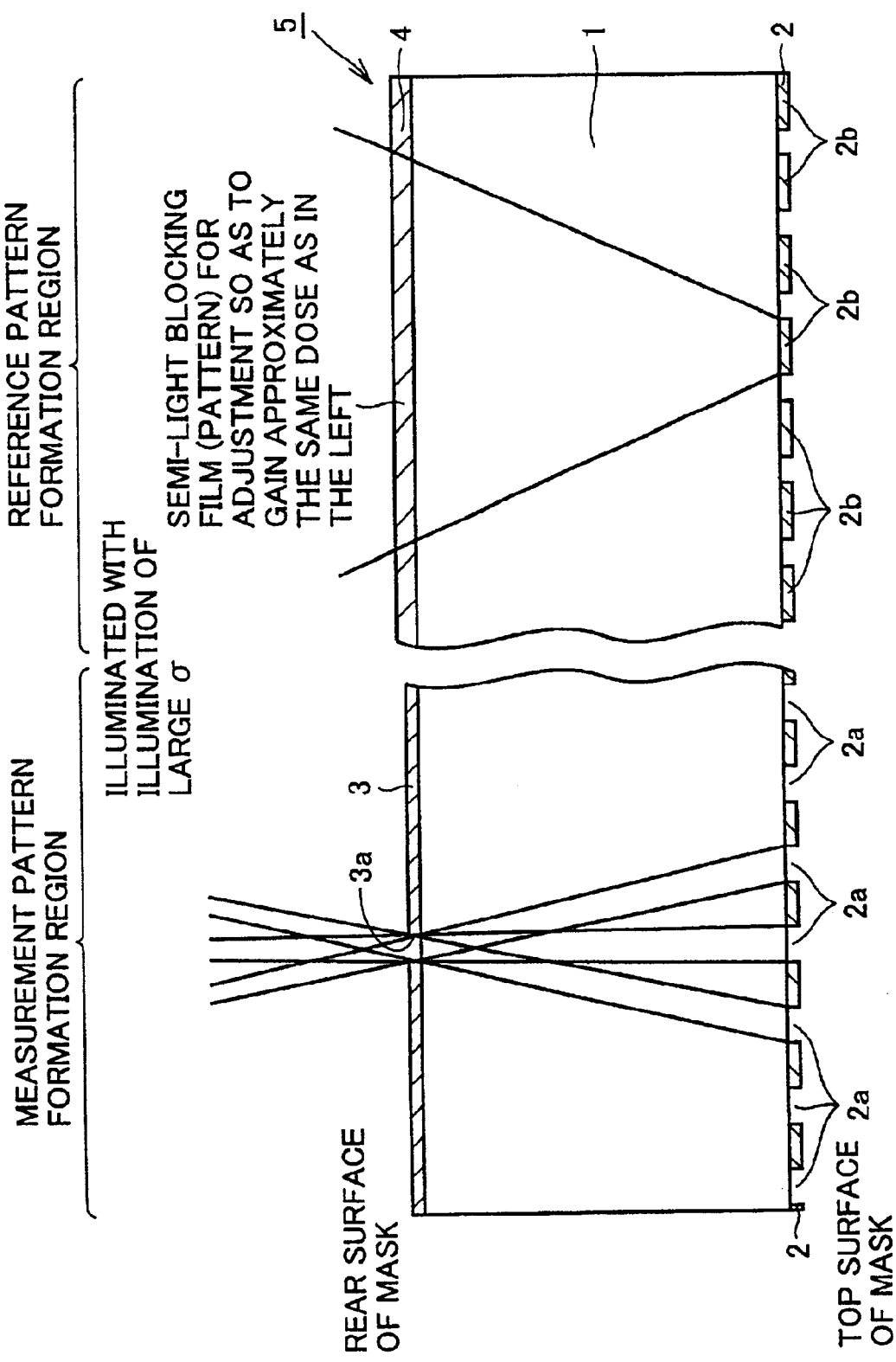
FIG. 16 is a cross sectional view schematically showing another configuration of the photomask used in the aberration measurement method according to the first embodiment of the present invention.
Figure 17C:
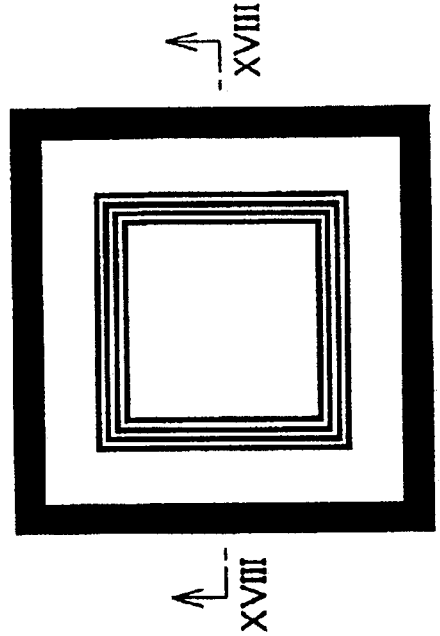
FIGS. 17A, 17B and 17C are plan views showing patterns of photomasks used for a conventional aberration measurement method and a pattern for measurement that is formed in the photoresist by using these.
Figure 17B:
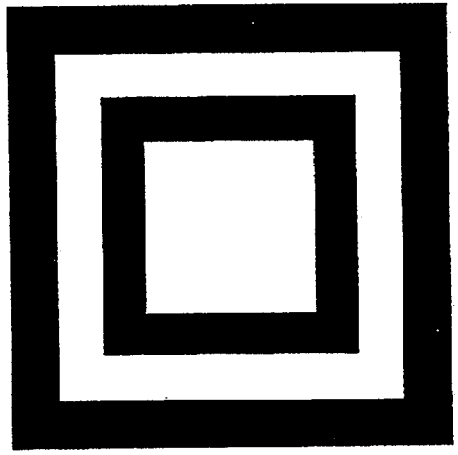
Figure 17A:
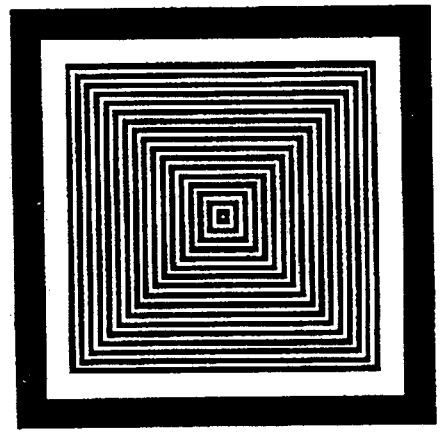
Figure 18A:
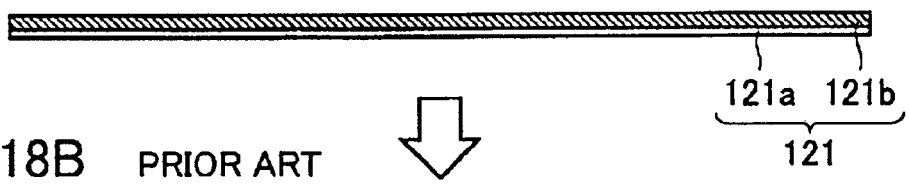
FIGS. 18A to 18F are schematic cross sectional views showing the appearance of forming a pattern for measurement in a photoresist through a double exposure in the conventional aberration measurement method.
Figure 18B:
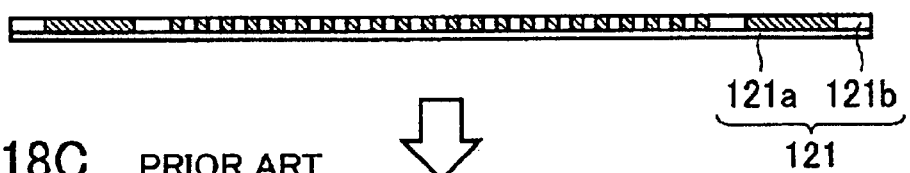
Figure 18C:
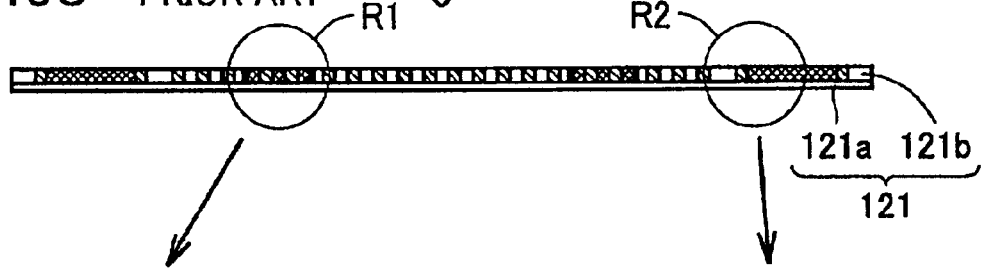
Figure 18D:
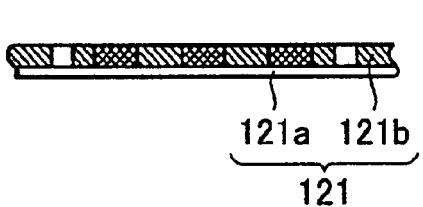
Figure 18E:
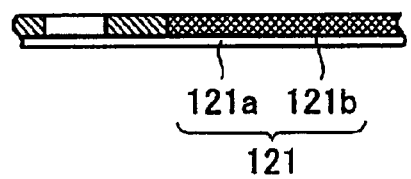
Figure 18F:
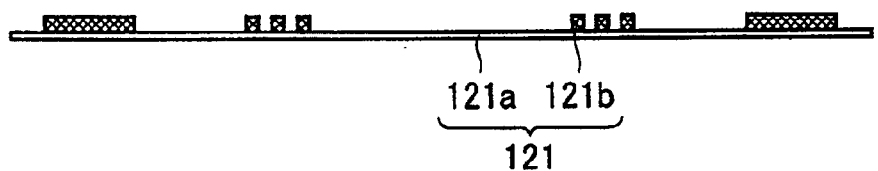

Here, photomask 5 may have a configuration wherein semi-light blocking film 4 is provided on the rear surface of substrate 1 in the reference pattern formation region as shown in FIG. 16. This semi-light blocking film 4 can allow the light intensity of the exposure light after passing through photomask 5 to be the same in the measurement pattern formation region and in the reference pattern formation region. The parts of the configuration other than this part are approximately the same as the configuration shown in FIG. 2 and, therefore, the same symbols are attached to the same members, of which the descriptions are omitted.

Second Embodiment

In the above described first embodiment, the case of measuring a box-in-box type mark as a pattern for measuring the amount of positional shift by means of an overlap inspection unit is described, the position of the pattern formed in the photoresist may be measured by a stepper. That is to say, a stepper, in general, has a function of measuring the coordinate for positioning relative to the base pattern and, therefore, the position of the pattern formed in the photoresist can be measured by using this coordinate measuring function.

In this case, the form of the pattern for measuring the amount of positional shift is not limited to the form (for example, a box-in-box type mark) that can be inspected by an overlap inspection unit but, rather, may be a form used as a coordinate measuring mark pattern for a stepper.

Here, the configuration of the parts other than this, the aberration measurement method and the like, are the same as in the first embodiment, of which the descriptions are omitted.

Third Embodiment

Though in the above described second embodiment the case is described wherein the amount of positional shift is measured by using a coordinate measurement function of the stepper, the position of the pattern formed on a photoresist may be measured by a coordinate measuring unit that is provided separately from the stepper.

In this case, the form of the pattern for measuring the amount of positional shift is not limited to the form used as the coordinate measurement mark pattern for the stepper but, rather, it can be a form (for example, a line pattern in a cross form) that is measurable by a coordinate measuring unit.

Here, the configuration of the parts other than the above, the aberration measuring method, and the like, are the same as in the first embodiment, of which the descriptions are omitted.

A modified illumination such as a ring band illumination or a quadruple polar illumination may be used, or a conventional illumination may be used, in the above described first to third embodiments.

Here, a layout design is carried out that makes a pattern formation with a high precision possible with the lens aberration of the projection optical system measured according to the above described aberration measurement methods of the first to third embodiments based on this aberration and, thereby, the mask pattern used in the design is transferred and processes such as etching and ion injections are carried out on the film beneath the transferred resist pattern by using this resist pattern so that a desired semiconductor device can be manufactured with a high precision.

In addition, by utilizing the focus monitoring method of the present invention other devices (electronics devices) such as a thin film magnetic head or a liquid crystal display element, in addition to a semiconductor device, can also be formed with a high precision.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask for aberration measurement for measuring a lens aberration in a projection optical system of an exposure unit, comprising:

a substrate that allows an exposure light to pass through and that has a measurement pattern formation region and a reference pattern formation region;

a plurality of measurement patterns formed on a top surface of said substrate in said measurement pattern formation region;

a light blocking film that is formed on a rear surface of said substrate in said measurement pattern formation region and that has a rear surface aperture pattern for substantially differentiating respective incident angles of an exposure light that enters each of said plurality of measurement patterns; and a plurality of reference patterns formed on the top surface of said substrate in said reference pattern formation region, wherein the rear surface of said substrate in said reference pattern formation region is formed so that respective incident angles of an exposure light that enters said plurality of reference patterns are substantially the same.

2. The photomask for aberration measurement according to claim 1, characterized in that ½ of the diameter dimension of said rear surface aperture pattern satisfies sin(φ)≦(NA/M)/5, where a scale down projection ratio is M, a numerical aperture is NA and a half angle of a viewing angle of said rear surface aperture pattern as seen from a point on the top surface of said substrate that is directly opposite to the center position of said rear surface aperture pattern is φ.

3. The photomask for aberration measurement according to claim 1, characterized in that ½ of the dimension of each of said plurality of measurement patterns satisfies sin(ζ)≦(NA/M)/5 where a scale down projection ratio is M, a numerical aperture is NA and a half angle of a viewing angle of said measurement pattern as seen from a point on the rear surface of said substrate that is opposite to the center position of said measurement pattern is ζ.

4. The photomask for aberration measurement according to claim 1, characterized in that at least some of said plurality of measurement patterns are positioned within a range of a viewing angle 2α that satisfies sin(α)≦(NA/M)×σ where a scale down projection ratio is M, a numerical aperture is NA and a ratio of the sine of the half angle of the spread of an angle of illumination with which the rear surface of the mask is irradiated to NA is σ.

5. The photomask for aberration measurement according to claim 1, characterized in that the center position of each pattern of said plurality of reference patterns has the same arrangement as of the center position of each pattern of said plurality of measurement patterns.

6. The photomask for aberration measurement according to claim 1, characterized in that said light blocking film has an aperture with a constant aperture ratio in a region of the rear surface of said substrate wherein a viewing angle β as seen from the top surface of said substrate, having a point on the rear surface of said substrate that is opposite to an arbitrary point positioned in a region where said plurality of reference patterns are arranged as the center, satisfies sin(β) ≧(NA/M)×σ where a scale down projection ratio is M and a numerical aperture is NA.

7. The photomask for aberration measurement according to claim 1, characterized in that the rear surface aperture pattern that is formed on the rear surface of said substrate in said measurement pattern formation region and that is for substantially differentiate respective incident angles of an exposure light that enters each of said plurality of measurement patterns is circular.

8. The photomask for aberration measurement according to claim 1, characterized in that the external form of each of said plurality of measurement patterns is a square.

9. The photomask for aberration measurement according to claim 1, characterized in that the external form of each of said plurality of reference patterns is a square.

10. The photomask for aberration measurement according to claim 1, characterized in that each of said plurality of measurement patterns is arranged at a point that form tetragonal lattice and that a viewing angle δ of ½ of the pitch P of the points that form said tetragonal lattice as seen from the rear surface of said substrate that is directly opposite to a point that forms said tetragonal lattice satisfies sin(δ)≦(NA/M)/5 where a scale down projection ratio is M and a numerical aperture is NA.

11. The photomask for aberration measurement according to claim 10, characterized in that the pitch P of the points that form said tetragonal lattice satisfies P/M≧20 μm where a scale down projection ratio is M.

12. The photomask for aberration measurement according to claim 8, characterized in that either one of said measurement pattern and said reference pattern corresponds to an inner box pattern of a box-in-box type mark while the other of said measurement pattern and said reference pattern corresponds to an outer box pattern.

* * * * *